US010901037B2

United States Patent
Wight et al.

(10) Patent No.: US 10,901,037 B2
(45) Date of Patent: Jan. 26, 2021

(54) METHOD AND APPARATUS FOR MONITORING STATUS OF RELAY

(71) Applicant: ONTARIO POWER GENERATION INC., Toronto (CA)

(72) Inventors: Jason Wight, Whitby (CA); Ahmed Abdelsamie, Stittsville (CA); Kasia Izdebska, Toronto (CA)

(73) Assignee: Ontario Power Generation Inc.

( * ) Notice: Subject to any disclaimer, the term of this patent is extended or adjusted under 35 U.S.C. 154(b) by 78 days.

(21) Appl. No.: 16/202,527

(22) Filed: Nov. 28, 2018

(65) Prior Publication Data
US 2019/0162788 A1    May 30, 2019

Related U.S. Application Data

(60) Provisional application No. 62/591,461, filed on Nov. 28, 2017.

(51) Int. Cl.
| | |
|---|---|
| *G01R 31/327* | (2006.01) |
| *H01H 47/00* | (2006.01) |
| *G05B 19/042* | (2006.01) |
| *H04W 4/80* | (2018.01) |
| *H04L 29/08* | (2006.01) |

(52) U.S. Cl.
CPC ....... *G01R 31/3278* (2013.01); *G05B 19/042* (2013.01); *G05B 19/0425* (2013.01); *H01H 47/002* (2013.01); *H04L 67/12* (2013.01); *H04W 4/80* (2018.02)

(58) Field of Classification Search
CPC . G01R 31/3278; G05B 19/042; H01H 47/002
See application file for complete search history.

(56) References Cited

U.S. PATENT DOCUMENTS

| | | | |
|---|---|---|---|
| 9,125,044 B2* | 9/2015 | Yang | H04L 61/2038 |
| 9,912,983 B2* | 3/2018 | Wang | H04L 67/22 |
| 10,244,570 B2* | 3/2019 | Ko | H04L 69/14 |
| 2011/0113154 A1* | 5/2011 | Maruyama | H04L 12/437 |
| | | | 709/238 |
| 2015/0099464 A1* | 4/2015 | Kiat | H01H 71/00 |
| | | | 455/41.1 |
| 2015/0271678 A1* | 9/2015 | Yaosaka | H04W 12/08 |
| | | | 726/4 |
| 2016/0021219 A1* | 1/2016 | Brown | A61B 6/566 |
| | | | 370/216 |
| 2017/0064251 A1* | 3/2017 | Soneda | H04N 7/147 |
| 2018/0145869 A1* | 5/2018 | Hu | H04L 41/0677 |
| 2018/0364874 A1* | 12/2018 | Herlong, II | G06F 3/0482 |

* cited by examiner

*Primary Examiner* — Dominic E Hawkins
(74) *Attorney, Agent, or Firm* — Calfee, Halter & Griswold LLP (57) ABSTRACT

A monitoring apparatus configured to monitor status of a relay, the monitoring apparatus comprising: a connector, for mating with corresponding pins of the relay; a microcontroller unit (MCU), for detecting a status of the relay from the pins of the relay; and a Near Field Communication (NFC) unit, for reporting the status of the relay to a NFC reader.

18 Claims, 9 Drawing Sheets

METHOD AND APPARATUS FOR MONITORING STATUS OF RELAY

CROSS-REFERENCE TO RELATED APPLICATION

The present disclosure claims priority from, and any other benefit of, U.S. provisional patent application No. 62/591,461, filed Nov. 28, 2017, the entirety of which is hereby incorporated by reference.

TECHNICAL FIELD

The present disclosure relates to troubleshooting failure of relays, in particular methods and apparatuses for monitoring status of a relay.

BACKGROUND

As information technologies evolve, relays, such as solid state relays or mechanical relays, are used extensively in the nuclear industry, for example in order to drive loads, trigger alarms, provide on or off time delays, isolate equipments, or drive other relays to perform a specific function. In order for a relay to change status, the coil of the relay must be activated or deactivated, which typically comes from an external event, such as loss of voltage, over current, ground fault detection, push button activation, or position of an upstream hand switch.

The activation of a particular relay may also depend on other relays in a sequence before the particular relay receives a trigger signal to operate. However, the position of every relay in the sequence is typically not known. Only if the final relay in the sequence manages to drive a load, can it be assumed that all the relays, in the sequence leading up to and including the final relay driving the load, operated properly.

If a relay in the sequence fails to perform its function, a troubleshooting process needs to be carried out by the engineering and maintenance crews, which typically includes choosing which relay in the sequence need to be monitored in order to identify failure performance of the relay. This troubleshooting process is conventionally completed with use of external monitoring equipment which typically has channel limitations. For example, conventional external monitoring equipment from Yokogawa Electric Corporation or from Hioki E. E. Corporation typically has a maximum of 16 channels, meaning only 16 relays can be monitored at one time. Moreover, choosing which relay to be monitored in the sequence is based on an educated guess based on the type of failure that was observed. Oftentimes, the troubleshooting process needs to be executed multiple times if the proper relays were not chosen to be monitored from the beginning. Thus, the process of troubleshooting can prove to be financially taxing, can significantly impact station resources, scheduling, and can have the potential to push electrical work into a critical path of a unit outage.

The educated guess to choose which relay to be monitored, as well as the limited number of channels of the external monitoring equipment may not be the only limitations to conventional troubleshooting techniques. The conventional external monitoring equipment typically will not disclose what is actually wrong with the relay (e.g., inadequate voltage, loose wiring, or other factors). It will only indicate the position of the monitored relays in the sequence and display when a particular relay has changed status or a particular relay failed to change status. The engineering and maintenance crews must use other data and/or their own know-how to understand why a relay is exhibiting a particular behavior. Such conventional troubleshooting process is time-consuming and very costly to a plant.

Thus, solutions for improving efficiency of monitoring relays' performance are desired.

SUMMARY

The present disclosure describes example approaches that enable a monitoring apparatus to monitor status of a relay without dislocating or removing the relay from a panel frame. By incorporating a Near Field Communication (NFC) unit for powering up a microcontroller unit (MCU) in a monitoring apparatus, examples described herein can address disadvantages of conventional monitoring equipment, such as channel limitations of external monitoring equipment and improper diagnoses challenges, in at least some applications. In at least some examples, methods and apparatuses for monitoring status of a relay are provided, which may help to accurately and efficiently detect the status of the relay, such as voltage supply on the coil, status of contacts (e.g., open or closed), and current passing through the relay. Other information (e.g., identification information of the relay and ambient temperature) may also be detected.

According to one example aspect is monitoring apparatus for monitoring status of a relay, the monitoring apparatus comprising: a connector, for mating with corresponding pins of the relay; a microcontroller unit (MCU), for detecting a status of the relay from the pins of the relay; and a Near Field Communication (NFC) unit, for reporting the status of the relay to a NFC reader.

According to a further aspect, a method for monitoring status of a relay, performed by a monitoring apparatus, the method comprising: establishing a Near Field Communication (NFC) connection with a NFC reader; receiving a wake up signal from the NFC reader; detecting a status of the relay plugged into the monitoring apparatus; and sending the status of the SSR to the NFC reader via the NFC connection.

According to a further aspect, a method for monitoring status of a relay, performed by a Near Field Communication (NFC) reader, the method comprising: establishing a NFC connection with a monitoring apparatus mating with the relay; sending a wake up signal to the monitoring apparatus; receiving a status of the relay from the monitoring apparatus via the NFC connection.

BRIEF DESCRIPTION OF THE DRAWINGS

For a more complete understanding of the present invention, and the advantages thereof, reference is now made to the following description taken in conjunction with the accompanying drawings, in which.

Similar reference numerals may have been used in different figures to denote similar components.

DETAILED DESCRIPTION OF ILLUSTRATIVE EMBODIMENTS

In the industrial technology fields, including industrial and nuclear industries, conventional techniques for monitoring and troubleshooting relays may have challenges and drawbacks. Conventional troubleshooting processes may be complicated, and channel limitations of conventional external monitoring equipment may lead to improper diagnoses of a problem, need for repeated testing with an elimination technique, costly expense for maintenance and/or extended time period where a system is declared unavailable. Accordingly, methods and apparatuses for monitoring relays, including relays arranged in a sequence, are described herein. The disclosed methods and apparatuses may help to improve accuracy of monitoring relays' performance and efficiency of troubleshooting.

A relay, including but not limited to a solid state relay (SSR) or a mechanical relay, is an electrically operated switch, which is widely used in the nuclear industry. For example, the SSR is an electronic switching device that switches on or off when a small external voltage is applied across its control terminals and typically has three main modes of operation: (1) On Delay Mode; (2) Slow Release Mode; and (3) Reverse Delay Mode. Users select the different modes by means of an internal switch of the relay. Mounting switches inside the housing of the relay prevents tampering in usage.

Figure 1A:
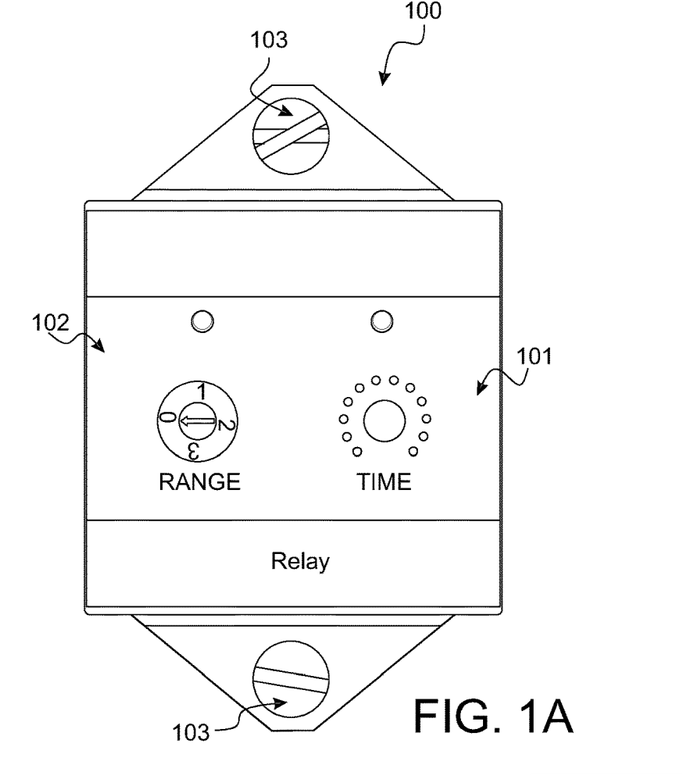
FIG. 1A is a top view of an example solid state relay.
Figure 1B:
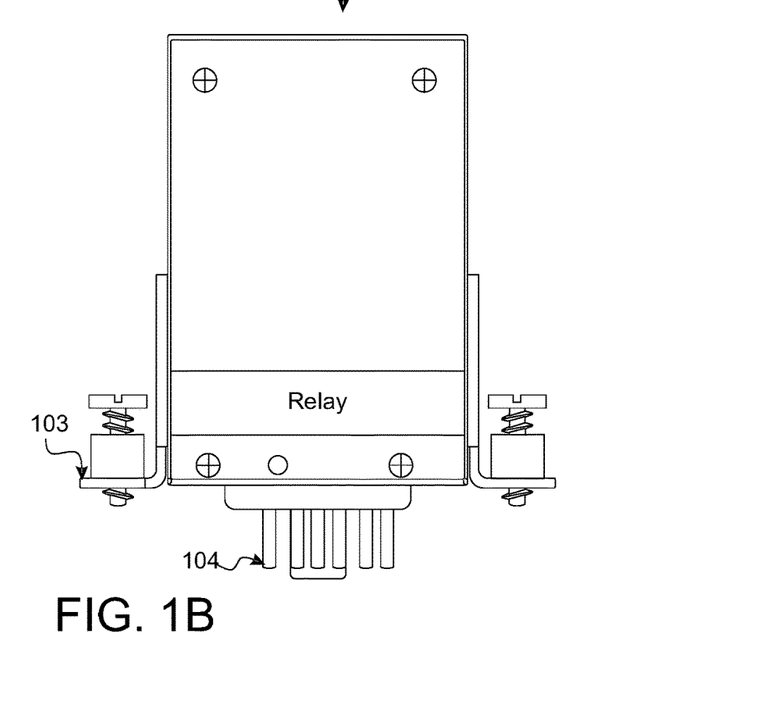
FIG. 1B is a side view of the solid state relay of FIG. 1A.

FIG. 1A provides a top view of an example relay, in this example an SSR 100. Although an SSR is illustrated and discussed below, this is only illustrative and is not intended to be limiting. In other examples, the relay may be any other suitable relay, including a mechanical relay. FIG. 1B is a side view of the SSR 100. The SSR 100 includes a front cover plate 101, a main housing 102, side flanges 103 for mounting, power supply, logic assembly boards and a plug base assembly. The power supply and logic assembly boards are mounted within the main housing 102. The SSR 100 is mountable on a panel using the side flanges 103 of the main housing 102. The SSR 100 includes a connector 104, in this example an octal connector, for connecting the SSR 100 with other electronic components, such as nuclear instruments. The connector 104 may be 8-pin octal connector with 8 pins or 11-pin octal connector with 11 pins. A monitoring apparatus, as disclosed herein, may be used to couple to and monitor the status of the SSR 100.

Figure 2A:
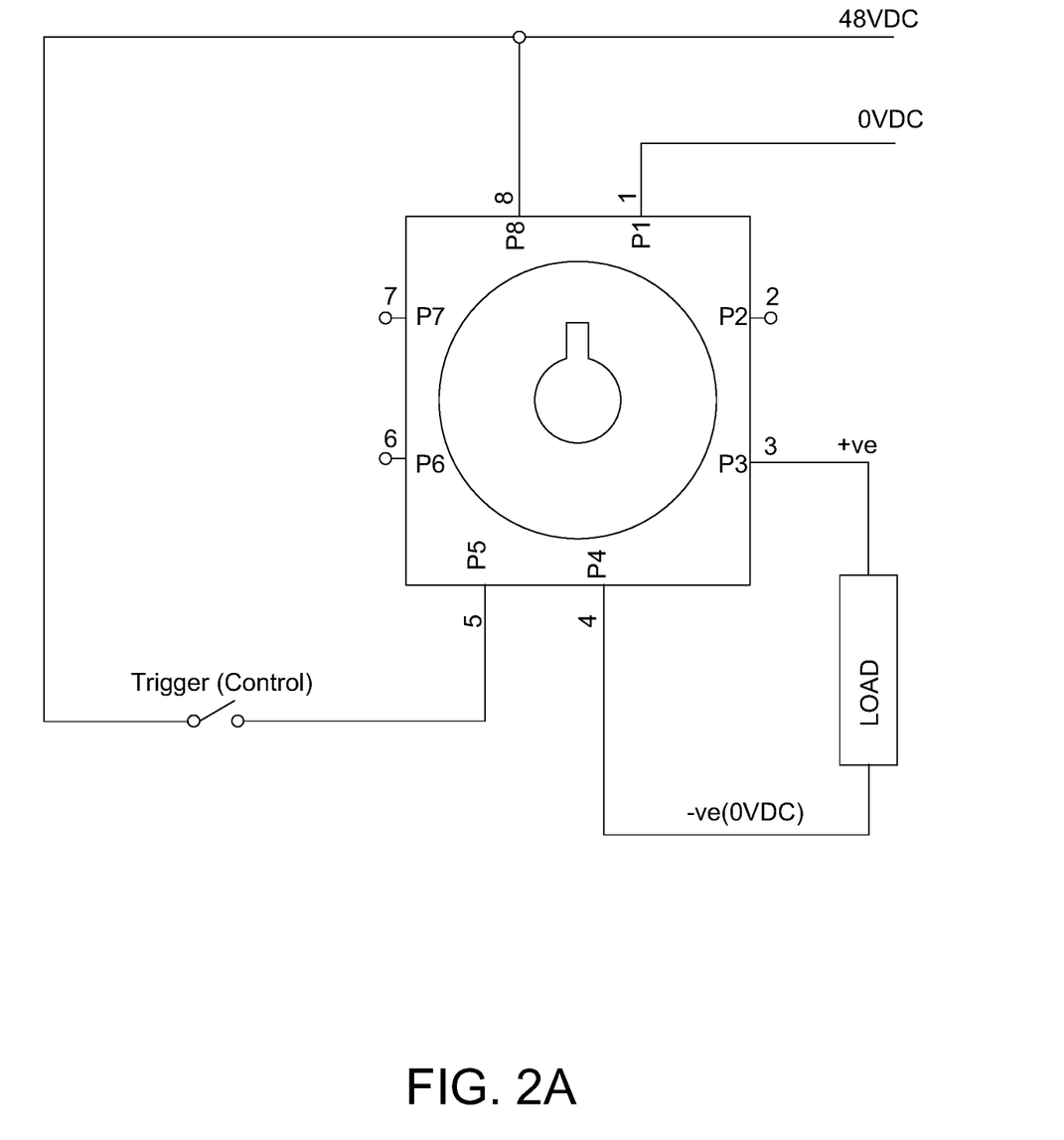
FIG. 2A is a diagram of pin connections of a 8-pin octal connector of an example solid state relay.
Figure 2B:
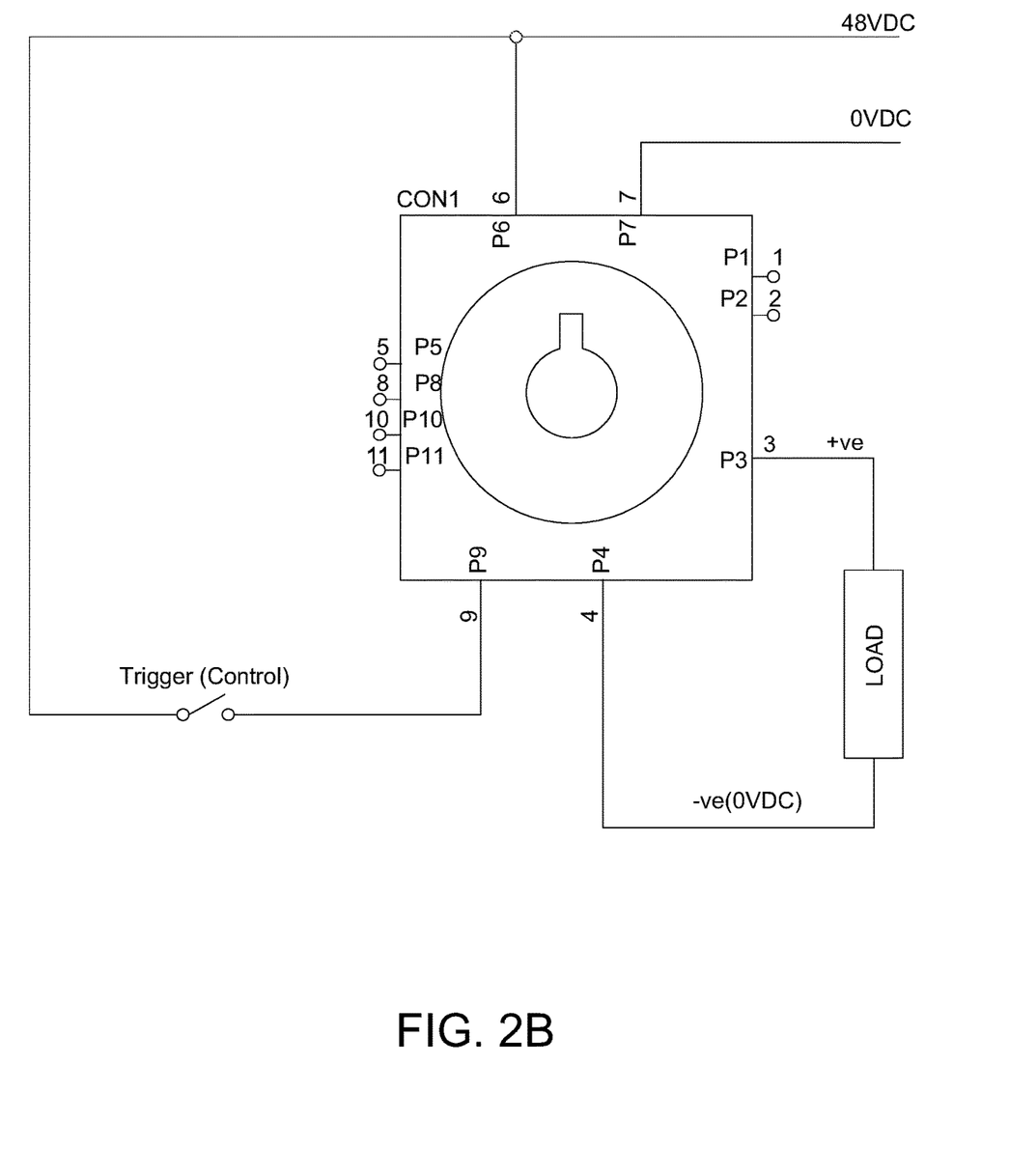
FIG. 2B is a diagram of pin connections of a 11-pin octal connector of an example solid state relay.

FIG. 2A shows example connections of 8 pins of the 8-pin octal connector. The pins may connect to different kinds of external circuitries to perform various functions, such as drive loads, trigger alarms, and so on. Similarly, example connections of 11 pins of the 11-pin octal connector are shown in FIG. 2B. The 11 pins may receive different kinds of input signal or transmit different kinds of output signal to perform various functions. The pins of the connector 104 of the SSR 100 may interface with and communicate signals to a monitoring apparatus, as disclosed herein.

Figure 3A:
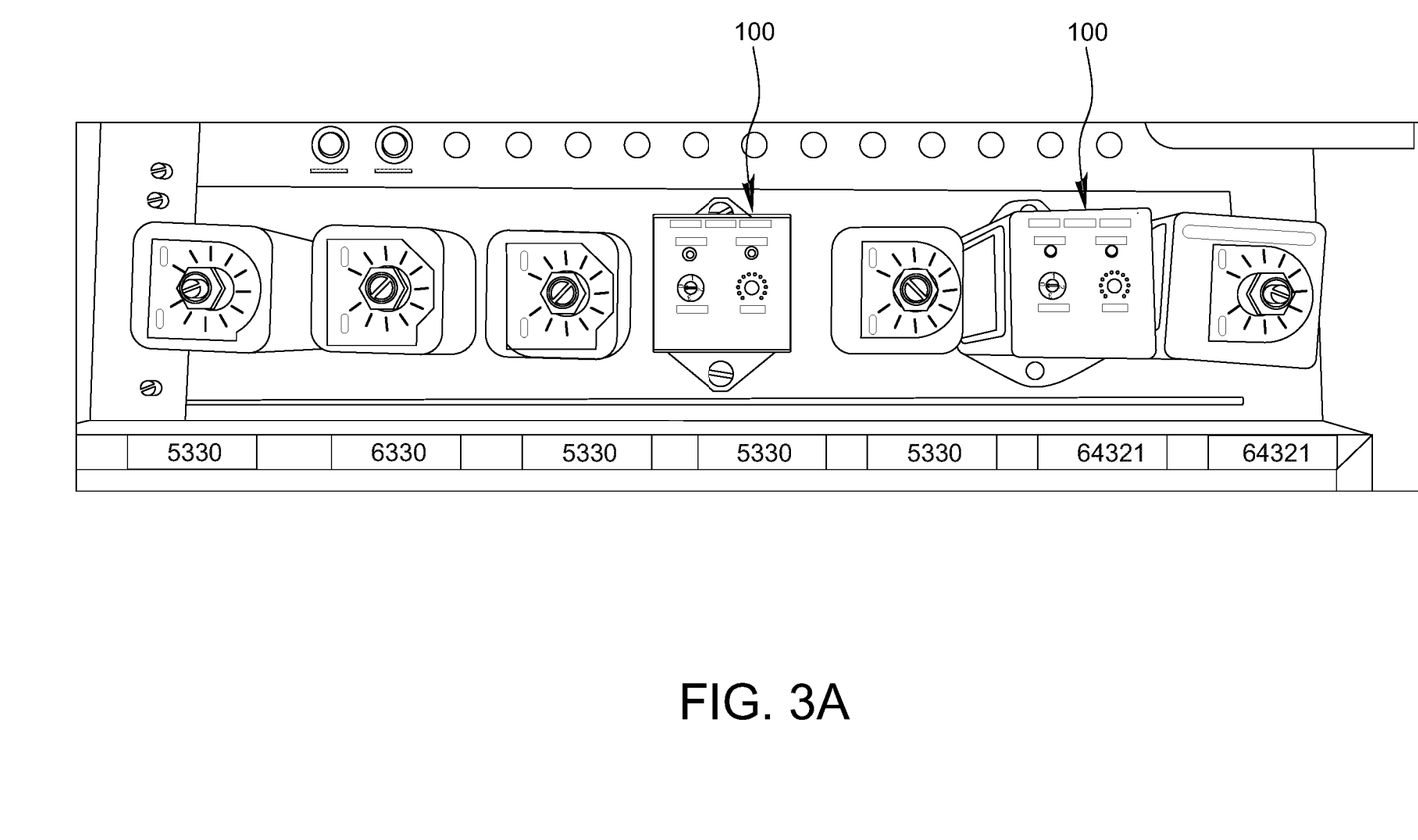
FIG. 3A is a front side view of an example mounting arrangement of a sequence of solid state relays.
Figure 3B:
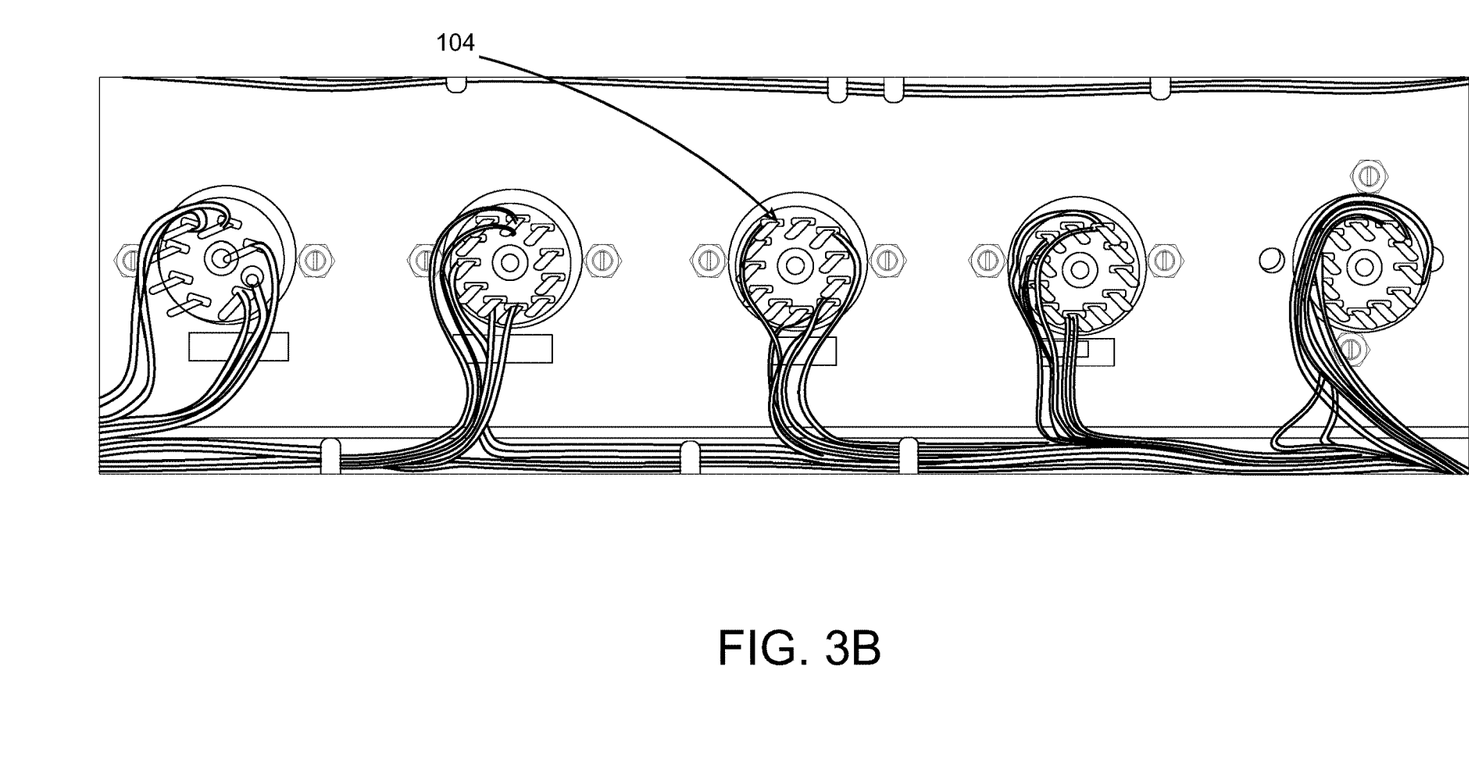
FIG. 3B is a back side view of the mounting arrangement of FIG. 3A.

FIG. 3A illustrates a front side view of an example mounting arrangement on a panel frame. A sequence of SSRs 100 are mounted on a panel frame using the side flanges 103 of each SSR 100. FIG. 3B shows a back side view of the mounting arrangement on a panel frame. The octal connector 104 of each SSR 100 is accessible at the back of the panel frame, for example to allow for wire wrapping around the pins of the connectors 104.

In order to monitor the SSR's status, external monitoring equipment (e.g., the monitoring apparatus disclosed herein) may access the back of the SSR where the octal connector is located, to obtain the status of the SSR from the pins. The mounting style of the SSRs shown in FIG. 3A may provide direct access to the octal connectors of the SSRs 100. Conventionally, monitoring the SSRs' performance is completed using conventional external monitoring equipment, by physically hooking each external monitoring equipment channel onto a particular pin of the SSR. The process of physically connecting each channel to each respective pin is very time consuming for the maintenance crews, and also poses a risk of activating or shorting adjacent relays in the panel frame.

In a conventional troubleshooting process for failed relays in a sequence, typically the troubleshooting process involves monitoring particular relays with conventional external monitoring equipment. The conventional monitoring equipment will indicate which relay changed status (e.g., opened or closed contacts), and then crews try to identify which relay failed to perform its function and figure out the reason for failure of this relay with the information the equipment provides.

However, conventional external monitoring equipment typically has a limited number of channels which limits the number of relays that can be monitored at one time. Conventional external monitoring equipment typically also has a limitation in terms of distance. For example, if the relays being monitored are far apart (e.g., in different rooms), multiple units of the conventional external monitoring equipment will be required, or the connection to the external monitoring equipment needs to be extended (e.g., with lengths of wiring), posing a tripping hazard in a room with sensitive equipments. Furthermore, in the case where only a subset of the total number of relays could be monitored (e.g., due to a limited number of channels on the monitoring equipment), if there is no issue identified in the particular relays that were monitored, a second (or third, or fourth, etc.) monitoring attempt on the remainder relays in the sequence needs to be completed until the issue is identified.

Figure 4A:
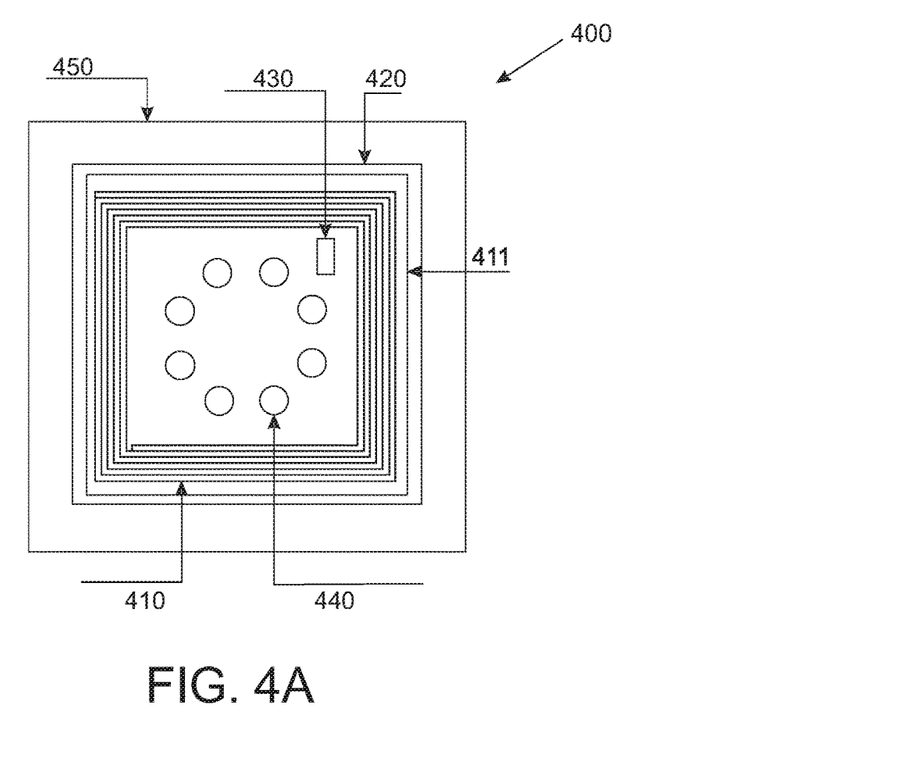
FIG. 4A illustrates a top view of a monitoring apparatus according to example embodiments of the disclosure.
Figure 4B:
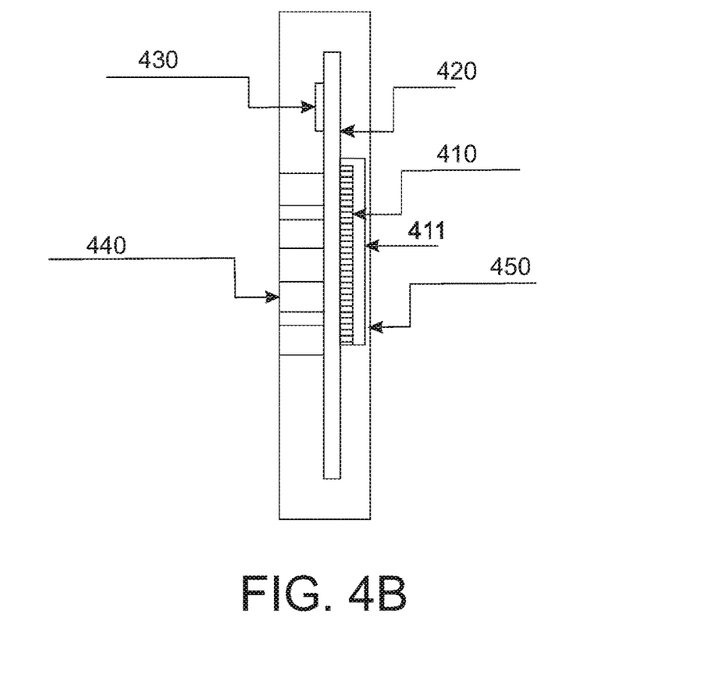
FIG. 4B illustrates a side view of the monitoring apparatus of FIG. 4A.

FIGS. 4A and 4B illustrate a top and a side view of a monitoring apparatus 400 which monitors status of a relay, such as the SSR 100 shown in FIG. 1A, in accordance with example embodiments disclosed herein. The monitoring apparatus 400 includes a Near Field Communication (NFC) antenna 410 within a NFC unit 411 disposed on a printed circuit board (PCB) 420, a microcontroller unit (MCU) 430 and a connector, in this example the connector is a set of sockets 440. The monitoring apparatus 400 has a plastic housing 450 to house the PCB 420 with various components in it. In an example embodiment, the PCB 420 includes a conductive ground plane layer with a ground connection, one or more dielectric layers, and one or more layers of conductive traces for distributing control and power signals throughout the PCB 420. By way of non-limiting example, in one possible configuration, the monitoring apparatus 400 is a square to fit directly with the octal connector of the SSR 100, although several other shapes and sizes are possible. By configuration the monitoring apparatus 400 to suit the shape and size of the SSR octal connector, no modification to the SSR or its surrounding circuitry may be needed.

As shown in FIG. 4B, in example embodiments, the NFC unit 411 is formed from a NFC antenna 410 disposed in the bottom of the PCB to establish a communication in a short distance with a recipient electronic device, for reporting the status of the SSR 100 to the recipient electronic device. The recipient electronic device may be a NFC reader device enabled for NFC communications, including but not limited to cell phones, smart phones, laptops, tablet computers, or machine-type communication devices PAD. The MCU 430 is mounted on the top of the PCB 420 to control the NFC connection with the recipient electronic device and process the data received from the pins of the relay, via the sockets 440. In the example shown, the sockets 440 mate with the pins of the octal connector of the SSR 100 in a circle around the PCB 420. In some example, the sockets 440 may be manufactured on a separate board from the PCB 420, for example to facilitate meeting other form factor requirements of the relays without having to modify the PCB 420.

Figure 5A:
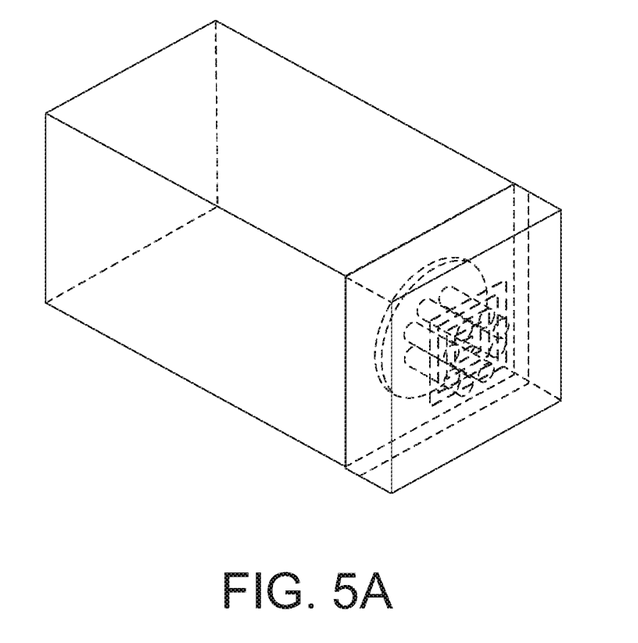
FIG. 5A shows a perspective view of a connection between an example solid state relay and a monitoring apparatus according to example embodiments of the disclosure.
Figure 5B:
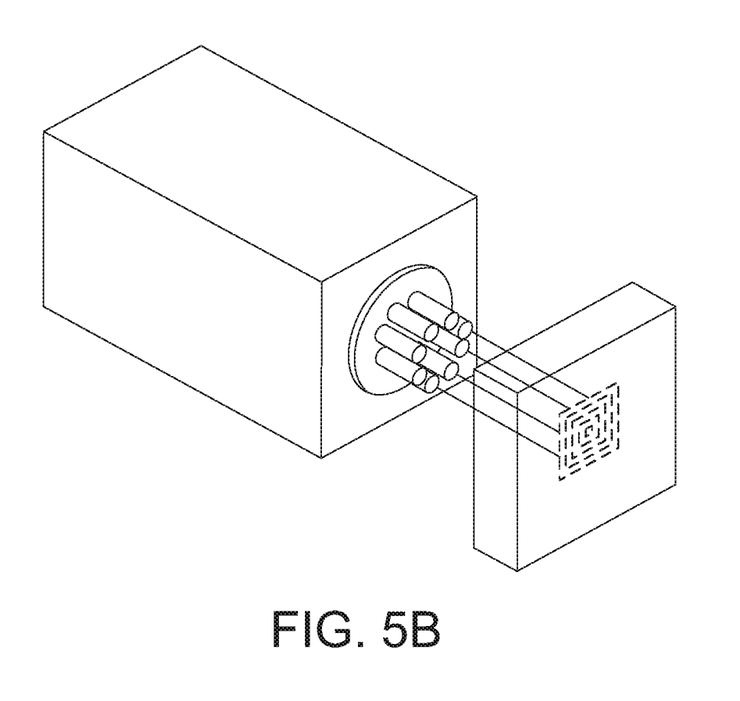
FIG. 5B shows an exploded view of the connection of FIG. 5A.
Figure 5C:
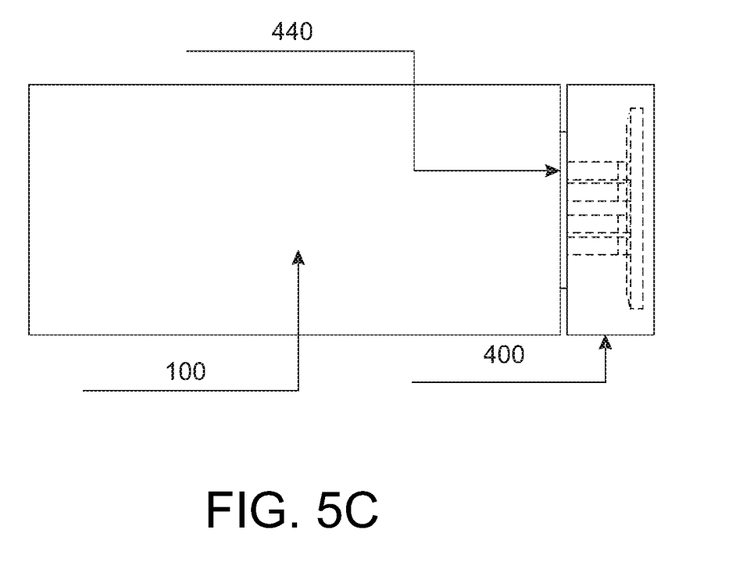
FIG. 5C shows a transparent side view of the connection of FIG. 5A.

FIG. 5A shows a 3-dimensional view of an assembled structure in which the SSR 100 is plugged into the sockets of the monitoring apparatus 400 in example embodiments. FIG. 5B illustrates a 3-dimensional view of an exploded structure in which the octal connector of the SSR 100 mates with the sockets of the monitoring apparatus 400 in example embodiments. FIG. 5C is a transparent side view of the assembled structure. The octal connector of the relays 100 may be plugged into the sockets of the monitoring apparatus 400. The design of the sockets 440 depends on the number of the octal connector's pins. For example, if the octal connector is an 8-pin octal connector with 8 pins, the number of the sockets is 8 for mating with corresponding pins; if the octal connector is an 11-pin octal connector with 11 pins, the number of the sockets is 11 for mating with corresponding pins of the relays 100. Moreover, the pins of the octal connector of the SSR 100 typically has a particular pin sequence for the triggering signal, as well as the input signal to the pins. As such, the monitoring apparatus 400 may have a marking to assist with alignment of the monitoring apparatus 400 with the octal connector of the SSR 100 (e.g., a marking indicating pin #1), for preventing misalignment or improper mating between the monitoring apparatus 400 and the SSR 100. Therefore, the risk of improper connection of conventional external monitoring equipment and time consumption associated with connecting the SSR 100 to the conventional external monitoring equipment (i.e., from Yokogawa Electric Corporation or from Hioki E. E. Corporation), or any other equipment of similar nature, may be eliminated. When the octal connector is plugged into sockets of the monitoring apparatus 400, the monitoring apparatus 400 is pressed onto the octal connector of the SSR 100 and spring loaded connectors existing on the PCB 420 of the monitoring apparatus 400 will keep the pins of the octal connector inside of the sockets to ensure the octal connector of the SSR 100 and the sockets of the monitoring apparatus 400 have adequate electrical contacts. This may help to ensure accurate detection of signals by the monitoring apparatus and accurate transfer of data to a NFC reader device. Installing the monitoring apparatus 400 directly onto the octal connector of the SSR 100 without dislocating or removing the SSR from service, decommissioning the SSR, or declaring the system or component unavailable may be easier to report status of a relay than conventional troubleshooting techniques. In this case, there is no distance limitation for the monitoring apparatus to monitor the SSR 100 that are far apart (e.g., in different rooms) without the requirement of multiple conventional external monitoring equipments.

Figure 6:
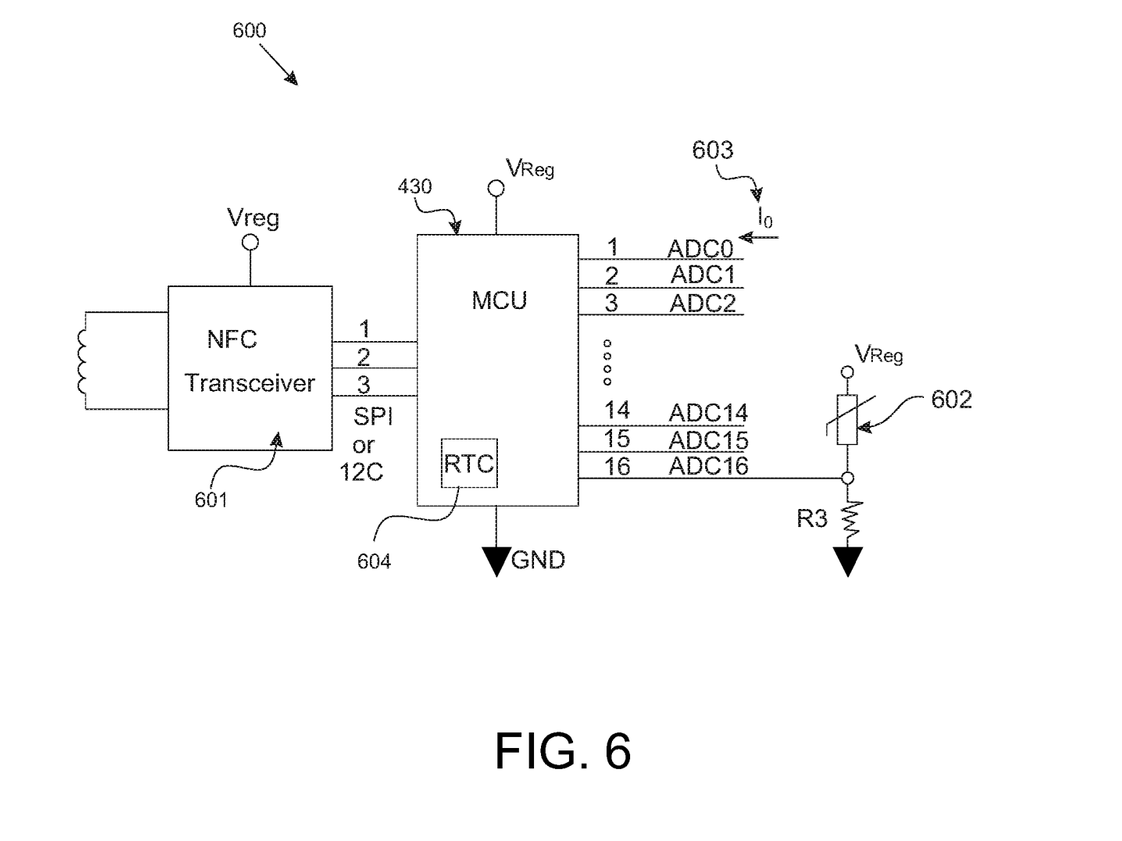
FIG. 6 shows a schematic diagram of an example control circuit within the monitoring apparatus of FIG. 4A.

Referring to FIG. 6, examples of a diagram of a control circuit 600 will be described in greater detail, showing a connection between the microcontroller unit (MCU) 430 and the NFC unit 411 with the NFC antenna 410 in the monitoring apparatus 400. The control circuit 600 is passively powered from any suitable NFC reader device, such as any ISO 14443A reader device. Thus, power to the control circuit 600 may be supplied from the recipient electronic device which establishes a NFC connection with the monitoring apparatus 400, eliminating the need of a continual power supply and enabling a battery-less design. As such, the risk of overloading the relay during operation is reduced or eliminated. In one example embodiment, a power management section is a module within the NFC unit 411 that enables a self powering mechanism to the control circuit 600.

In the example shown in FIG. 6, the control circuit 600 includes a NFC transceiver 601 disposed within the NFC unit 411, the MCU 430, and a temperature sensor 602. The MCU 430 in the control circuit 600 may be equipped with a Analog-to-Digital Converter (ADC), for example a 10-bit or higher, 12 channel ADC, and each ADC may be coupled to the pins of the SSR 100 to detect the voltage signals of the pins of the SSR 100 plugged into the connector of the monitoring apparatus 400. In an example embodiment, each ADC is electronically connected to a resistor R0 and a resistor R1, for example as shown with respect to a single ADC in FIG. 8. The maximum input value of each ADC channel is gated by the ratio of R0/R1. The R0 and R1 may be picked to have an extremely high input impedance (e.g., over 1 MΩ) that consumes a few micro-amperes in order to detect the voltage signals of the pins of the SSR 100 and avoid creating any loading effect on the SSR themselves. The current (I) that goes into each ADC channel may be a few micro-amperes, such as the current $I_0$ 603. In one example, a pin of the MCU is coupled to ground and another pin of the MCU is coupled to a voltage $V_{reg}$.

In one example embodiment, the voltage signals detected by the MCU comprise at least one of Manufacturer Part Number (MPN), status of contacts (such as opened or closed), or voltage supply on coils of the SSR 100, among other possible signals. In some example embodiments, the MCU 430 is coupled to the temperature sensor 602 to detect an ambient temperature profile. As shown in FIG. 6, an ADC 16 is coupled to an end of the temperature sensor 602 and an end of a resistor R3. The temperature sensor 602 is coupled in series with the resistor R3 between the voltage $V_{reg}$ and ground. An example resistance of the resistor R3 may about 10 KΩ.

With reference to FIG. 6, the MCU 430 may be coupled to the NFC transceiver 601 via a Serial Peripheral Interface (SPI) bus or an Inter-Integrated Circuit (I2C) bus to report the detected data to a recipient electronic device via the NFC transceiver. In one example, the NFC antenna 410 is disposed within the NFC transceiver 601 to receive a wake up signal from a NFC reader and send the detected data of the RRS to the recipient electronic device over a NFC connection.

In one example, the MCU 430 may have an internal real time clock (RTC) 604 to enable the MCU 430 to report a real-time stamp. In some examples, an external RTC may be used instead.

Non-volatile data, such as relay topology and programming parameters, ambient temperature profile of a relay or identification information (e.g., unique identifier of a relay such as a serial number) may be obtained via the NFC connection. Other equipment, such as thermography imaging equipment (e.g. infrared camera) or other data logger may not be needed. The NFC connection may also be used to obtain carry further diagnostics and monitoring information, as well as other information for referencing external databases.

Figure 7:
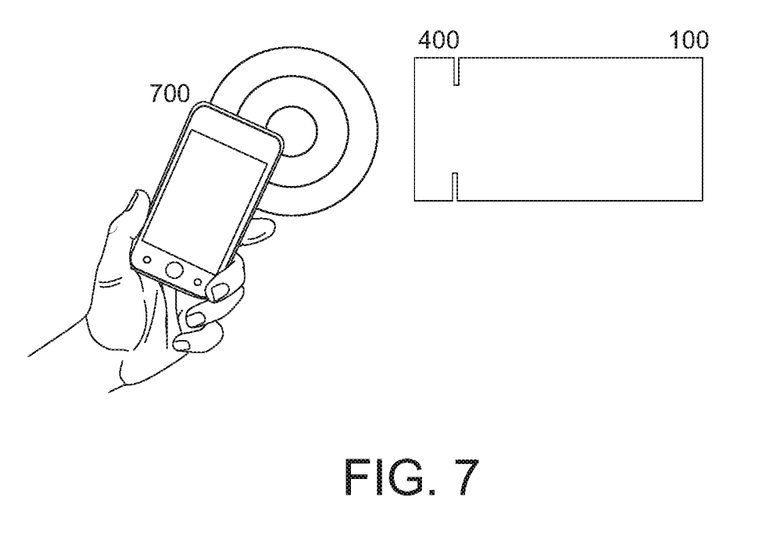
FIG. 7 is a schematic diagram of a recipient electronic device communicating with the monitoring apparatus via NFC connection.

An example embodiment for monitoring the performance of a relay will be described in greater detail with reference to FIG. 7. As shown in FIG. 7, when a recipient electronic device 700 enabled as a NFC reader approaches a SSR 100 plugged into the monitoring apparatus 400, the recipient electronic device 700 establishes a NFC connection with the monitoring apparatus 400. The recipient electronic device 700 communicates with the monitoring apparatus 400 via NFC tags to establish the NFC connection, with which the recipient electronic device 700 sends a request to retrieve report from the monitoring apparatus 400 and the monitoring apparatus 400 reports the status of the SSR 100 to the recipient electronic device 700. In one example, the NFC connection is established via a NFC communication protocol, and communication (e.g., reporting the status of the SSR 100) between the recipient electronic device 700 and the monitoring apparatus 400 is carried out using appropriate NFC protocols.

In the illustrated example, after the connection between the monitoring apparatus 400 and the recipient electronic device 700 is established, the recipient electronic device 700 sends a wake up signal to the monitoring apparatus 400 to wake up the MCU 430 within the monitoring apparatus 400. In one example, the wake up signal is an interrupt signal sent by the recipient electronic device 700. The recipient electronic device 700 with the NFC functionality is used as a power source for the monitoring apparatus 400 with the NFC unit 411. Therefore, there is no requirement of an external power supply to wake up the MCU 430 by receiving a waking up signal from the recipient electronic device 700. In one example embodiment, the status of the RRS 100 includes various parameters, and the various parameters of the SSR 100 are retrieved by the monitoring apparatus 400 from the octal connector of the SSR 100. The monitoring apparatus 400 then reports the status of the RRS 100 to the recipient electronic device 700 via the NFC connection. The parameters may include at least one of voltage supply on coils of the SSR, current passing through the SSR, status of contacts (open or closed) of the SSR, or identification of unused contacts of the SSR. In some examples, other information may be reported, such as identification information of the SSR, which may include MPN of the SSR or facility catalog identification number. In some examples, the ambient temperature profile may also be reported.

The recipient electronic device 700 can power up the MCU within the monitoring apparatus 400 as well as retrieve data, e.g., over a 13.56 MHz frequency, using a NFC reader, which may provide a safe method to monitor the performance of the relay instantaneously through wireless communication without a need for time-consuming connection of external monitoring equipment. Furthermore, the NFC unit 411 within the monitoring apparatus may only be used for reporting the status of the relay. NFC may not be used to control, steer, or modify the operation of the relay or surrounding circuitry, for maintaining the safety and security of a nuclear plant. It may be a non-invasive process to accurately detect voltages, status of contacts, and current passing through a mechanical relay with a monitoring apparatus receiving pins of an octal connector of the relay. Errors in relay monitoring due to conductivity or connectivity of the external monitoring equipment to the relay may be also eliminated. Further, independent relay logging may also be performed in any location, without being limited by the distance between the relays to be monitored. Monitoring the performance of a relay by the monitoring apparatus may not be limited in the number of relays that may be monitored, unlike the limitation imposed by the number of channels available on conventional external monitoring equipment. Further, there may not be any seismic restraint requirements.

Figure 8:
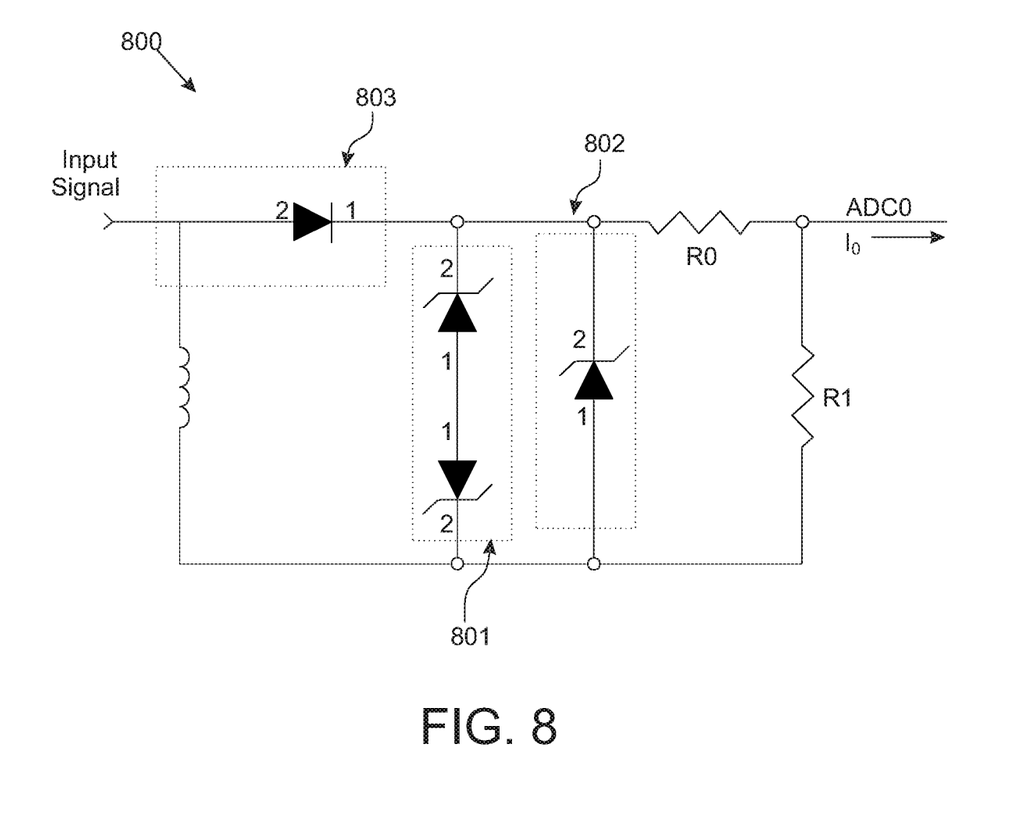
FIG. 8 is a schematic diagram of an example protection circuit coupled to the control circuit of FIG. 6 according to example embodiments of the disclosure.

Another example embodiment of coupling protection circuit 800 to the MCU of the control circuit 600 is described in great detailer with reference to FIG. 8. The protection circuit 800 incorporates an electrostatic discharge (ESD) protection circuit (indicated by dotted line 801), an over-voltage protection circuit (indicated by dotted line 802), and a reverse-polarity protection (indicated by dotted line 803) to protect the MCU from any potential damage. An instance of the protection circuit 800 may be coupled to the MCU for each relay pin at which the voltage is required to be detected.

In the present disclosure, methods and monitoring apparatuses for monitoring status of a relay are described. Monitoring parameters of a relay with NFC technique may not only reduce the possibilities of pulling wrong wires or impacting adjacent equipment in close proximity to the relay, but also eliminate risk of improper connection of conventional external monitoring equipment. Using the examples disclosed herein, status of a relay may be monitored without causing any loading effect on other signals passing through the relay. Further, the method of monitoring status of a relay may have no limitation in monitoring a large number of relays as well as the distance of monitoring relays that are far apart, such as in different rooms, which may detect voltages, status of contacts, and current passing through a relay accurately as well as reduce the trouble-shooting time and guesswork with the external monitoring equipments. A software interface provided on an NFC reader may be used for creating virtual dependencies and reverse engineering connectivity. Creation of virtual dependencies may be useful for debugging and tracing complicated and cascaded signal propagation over a control system by monitoring status of relays in the control system concurrently. Data may be logged from multiple NFC readers, for example using cloud services. In this way, virtual dependencies may be created between relays far away or close by with each other, for example using cloud services. Moreover, the disclosed monitoring apparatus does not require any power aside from the power provided by the querying NFC reader, hence the monitoring apparatus may not load or otherwise alter a signal read from the relay.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A monitoring apparatus configured to monitor status of a relay, the monitoring apparatus comprising:
    a socket connector, for mating with corresponding pins of the relay, wherein the socket connector has a total number of sockets corresponding to a total number of pins of an octal connector of the relay, the socket connector having a marking to indicate proper physical mating relationship to physically mate each socket with each corresponding pin of the octal connector of the relay;
    a microcontroller unit (MCU), for detecting a status of the relay from the pins of the relay; and
    a Near Field Communication (NFC) unit, for reporting the status of the relay to a NFC reader.

2. The monitoring apparatus of claim 1, further comprising a protection circuit coupled to the MCU to protect the MCU from any potential damage.

3. The monitoring apparatus of claim 1, wherein the MCU is further configured to detect an ambient temperature profile, and the ambient temperature profile is reported by the NFC unit.

4. The monitoring apparatus of claim 1, wherein the status detected by the MCU includes at least one of voltage supply on coils of the relay, current passing through the relay, status of contacts of the relay, or identification of unused contacts of the relay.

5. The monitoring apparatus of claim 1, wherein the MCU is further configured to detect identification information of the relay, and the identification information is reported by the NFC unit.

6. The monitoring apparatus of claim 1, wherein the MCU is powered by a wake up signal received by the NFC unit, wherein the wake up signal is received from the NFC reader.

7. The monitoring apparatus of claim 1, wherein the relay is a solid state relay or a mechanical relay.

8. A method for monitoring status of a relay, performed by a monitoring apparatus, the method comprising:
    establishing a Near Field Communication (NFC) connection with a NFC reader;
    receiving a wake up signal from the NFC reader;
    detecting a status of the relay plugged into the monitoring apparatus, wherein a socket connector of the monitoring apparatus has a total number of sockets corresponding to a total number of pins of an octal connector of the relay, the socket connector having a marking to indicate proper physical mating relationship to physically mate each socket with each corresponding pin of the octal connector of the relay; and
    sending the status of the relay to the NFC reader via the NFC connection.

9. The method of claim 8, further comprising detecting an ambient temperature profile.

10. The method of claim 8, wherein the status of the relay includes at least one of voltage supply on coils of the relay, current passing through the relay, status of contacts of the relay, or identification of unused contacts of the relay.

11. The method of claim 8, wherein the wake up signal is an interrupt signal.

12. The method of claim 8, further comprising detecting identification information of the relay.

13. A method for monitoring status of a relay, performed by a Near Field Communication (NFC) reader, the method comprising:
    establishing a NFC connection with a monitoring apparatus mating with the relay, wherein a socket connector of the monitoring apparatus has a total number of sockets corresponding to a total number of pins of an octal connector of the relay, the socket connector having a marking to indicate proper physical mating relationship to physically mate each socket with each corresponding pin of the octal connector of the relay;
    sending a wake up signal to the monitoring apparatus; and
    receiving a status of the relay from the monitoring apparatus via the NFC connection.

14. The method of claim 13, wherein the status of the relay includes at least one of voltage supply on coils of the relay, current passing through the relay, status of contacts of the relay, or identification of unused contacts of the relay.

15. The method of claim 13, further comprising receiving identification information about the relay from the monitoring apparatus.

16. The method of claim 13, further comprising receiving an ambient temperature profile from the monitoring apparatus.

17. The method of claim 13, wherein the wake up signal is an interrupt signal.

18. The method of claim 13, wherein the relay is a solid state relay or a mechanical relay.

* * * * *